(12) United States Patent
Chandrakasan et al.

(10) Patent No.: US 10,164,472 B2
(45) Date of Patent: Dec. 25, 2018

(54) METHOD AND APPARATUS FOR WIRELESSLY CHARGING PORTABLE ELECTRONIC DEVICES

(71) Applicant: Massachusetts Institute of Technology, Cambridge, MA (US)

(72) Inventors: Anantha Chandrakasan, Belmont, MA (US); Rui Jin, San Diego, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/911,599

(22) PCT Filed: Nov. 19, 2014

(86) PCT No.: PCT/US2014/066268
§ 371 (c)(1),
(2) Date: Feb. 11, 2016

(87) PCT Pub. No.: WO2015/084587
PCT Pub. Date: Jun. 11, 2015

(65) Prior Publication Data
US 2016/0268832 A1 Sep. 15, 2016

Related U.S. Application Data

(60) Provisional application No. 61/911,160, filed on Dec. 3, 2013.

(51) Int. Cl.
*H01F 27/42* (2006.01)
*H01F 37/00* (2006.01)
(Continued)

(52) U.S. Cl.
CPC .............. *H02J 50/12* (2016.02); *H02J 5/005* (2013.01); *H02J 7/0027* (2013.01);
(Continued)

(58) Field of Classification Search
CPC . H02J 5/005; H02J 7/025; H02J 17/00; H01F 38/14; B60L 11/182
(Continued)

(56) References Cited

U.S. PATENT DOCUMENTS 6,100,663 A 8/2000 Boys et al.
6,844,755 B2 1/2005 Ajit
(Continued)

FOREIGN PATENT DOCUMENTS

CN 103346591 A 10/2013
WO WO 01/03288 A1 1/2001
(Continued)

OTHER PUBLICATIONS

U.S. Appl. No. 15/290,402, filed Oct. 11, 2016, Perreault, et al.
(Continued)

*Primary Examiner* — Quan Tra
(74) *Attorney, Agent, or Firm* — Daly, Crowley, Mofford & Durkee, LLP

(57) ABSTRACT

Wireless charging of portable electronic devices is carried out by detecting load variations caused by the device and dynamically compensating for these variations during charging to increase system efficiency and regulate delivered power. In some embodiments, load variations are tracked by comparing a feedback signal to a value range and determining whether the feedback value is higher than, lower than, or within the range of values. This information is then used to modify one or more parameters associated with a power amplifier in a transmitter device.

15 Claims, 7 Drawing Sheets

(51) Int. Cl.
*H01F 38/00* (2006.01)
*H02J 50/12* (2016.01)
*H02J 50/40* (2016.01)
*H02J 5/00* (2016.01)
*H02J 50/10* (2016.01)
*H02J 7/00* (2006.01)
*H02J 7/04* (2006.01)
*H03F 3/19* (2006.01)
*H03F 3/217* (2006.01)
*H04B 1/3883* (2015.01)

(52) U.S. Cl.
CPC ............ *H02J 7/0054* (2013.01); *H02J 7/045* (2013.01); *H02J 50/10* (2016.02); *H02J 50/40* (2016.02); *H03F 3/19* (2013.01); *H03F 3/2176* (2013.01); *H03F 2200/451* (2013.01); *H04B 1/3883* (2013.01)

(58) Field of Classification Search
USPC .......................................................... 307/104
See application file for complete search history.

(56) References Cited

U.S. PATENT DOCUMENTS

| | | | |
|---|---|---|---|
| 7,276,857 B2 | 10/2007 | Logsdon et al. | |
| 7,474,062 B2 | 1/2009 | Boys et al. | |
| 7,522,878 B2 | 4/2009 | Baarman | |
| 7,605,496 B2 | 10/2009 | Stevens et al. | |
| 7,633,235 B2 | 12/2009 | Boys | |
| 7,639,514 B2* | 12/2009 | Baarman | A61L 2/10 363/16 |
| 7,675,197 B2 | 3/2010 | Tetlow | |
| 7,781,916 B2 | 8/2010 | Boys | |
| 8,050,068 B2 | 11/2011 | Hussmann et al. | |
| 8,076,801 B2 | 12/2011 | Karalis et al. | |
| 8,093,758 B2 | 1/2012 | Hussmann et al. | |
| 8,183,938 B2 | 5/2012 | Boys et al. | |
| 8,294,555 B2 | 10/2012 | Tetlow | |
| 8,667,452 B2 | 3/2014 | Verghese et al. | |
| 9,077,261 B2* | 7/2015 | Yamamoto | H02J 5/005 |
| 9,287,719 B2* | 3/2016 | Katsunaga | H03H 7/40 |
| 2006/0274469 A1 | 12/2006 | Nielsen | |
| 2008/0067874 A1* | 3/2008 | Tseng | A61C 17/224 307/104 |
| 2009/0174263 A1 | 7/2009 | Baarman et al. | |
| 2009/0302933 A1 | 12/2009 | Boys et al. | |
| 2010/0045114 A1 | 2/2010 | Sample et al. | |
| 2010/0148723 A1 | 6/2010 | Cook et al. | |
| 2011/0090723 A1 | 4/2011 | Hu et al. | |
| 2011/0117860 A1 | 5/2011 | Kimball | |
| 2011/0193417 A1 | 8/2011 | Hirasaka et al. | |
| 2011/0234011 A1 | 9/2011 | Yi et al. | |
| 2011/0241437 A1 | 10/2011 | Kanno | |
| 2011/0248571 A1 | 10/2011 | Kim et al. | |
| 2011/0254379 A1 | 10/2011 | Madawala | |
| 2011/0266882 A1 | 11/2011 | Yamamoto et al. | |
| 2011/0299313 A1 | 12/2011 | Hussmann et al. | |
| 2012/0002446 A1 | 1/2012 | Madawala et al. | |
| 2012/0038220 A1* | 2/2012 | Kim | H02J 7/025 307/104 |
| 2012/0049640 A1 | 3/2012 | Ichikawa et al. | |
| 2012/0049642 A1 | 3/2012 | Kim et al. | |
| 2012/0091989 A1 | 4/2012 | Uramoto et al. | |
| 2012/0146425 A1 | 6/2012 | Lee et al. | |
| 2012/0161538 A1 | 6/2012 | Kinoshita et al. | |
| 2012/0242164 A1 | 9/2012 | Teggatz et al. | |
| 2012/0242284 A1 | 9/2012 | Wheatley, III et al. | |
| 2012/0306284 A1 | 12/2012 | Lee et al. | |
| 2013/0070621 A1 | 3/2013 | Marzetta et al. | |
| 2013/0076154 A1 | 3/2013 | Baarman et al. | |
| 2013/0093390 A1 | 4/2013 | Partovi | |
| 2013/0099807 A1 | 4/2013 | Wheeland et al. | |
| 2013/0113299 A1 | 5/2013 | Von Novak et al. | |
| 2013/0181536 A1 | 7/2013 | Bhargawa et al. | |
| 2013/0229065 A1 | 9/2013 | Robertson et al. | |
| 2013/0272044 A1 | 10/2013 | Boys et al. | |
| 2013/0300357 A1 | 11/2013 | Mercier et al. | |
| 2013/0310630 A1 | 11/2013 | Smith et al. | |
| 2014/0021795 A1 | 1/2014 | Robertson et al. | |
| 2014/0097791 A1 | 4/2014 | Lisuwandi | |
| 2014/0159500 A1* | 6/2014 | Sankar | H02J 5/005 307/104 |
| 2017/0126071 A1* | 5/2017 | Aioanei | H02J 50/12 |

FOREIGN PATENT DOCUMENTS

| | | |
|---|---|---|
| WO | WO 2009/111597 A2 | 9/2009 |
| WO | WO 2009/111597 A3 | 9/2009 |
| WO | WO 2009/149464 A2 | 12/2009 |
| WO | WO 2012/037279 A1 | 3/2012 |
| WO | WO 2012/112703 A1 | 8/2012 |
| WO | WO 2013/006068 A1 | 1/2013 |
| WO | WO 2013/059300 A2 | 4/2013 |

OTHER PUBLICATIONS

U.S. Appl. No. 15/287,068, filed Oct. 6, 2016, Briffa, et al.
U.S. Appl. No. 15/354,170, filed Nov. 17, 2016, Briffa, et al.
Baker, et al.; "Feedback Analysis and Design of RF Power Links for Low-Power Bionic Systems;" IEEE Transactions on Biomedical Circuits and Systems, vol. 1; No. 1; Mar. 2007; pp. 28-38; 11 pages.
Jin, et al.; "Wirelessly Charging Portable Electronics Using Mobile Devices;" Power Point Presentation; http://video.mit.edu/watch/wireless-charging-with-an-energy-constrained-source-presented-by-superurop-student-rui-jin-13573/; Jan. 17, 2013; 9 pages.
Jin, et al.; "Rapid Wireless Charging with an Energy-Constrained Source;" SuperURP; MIT, EECS; Poster Displayer at Poster Session Dec. 6, 2012; 1 page.
Kendir, et al.; "An Optimal Design Methodology for Inductive Power Link With Class-E Amplifier;" IEEE Transactions on Circuits and Systems—I: Regular Papers; vol. 52; No. 5; May 2005; pp. 857-866; 10 pages.
Kim, et al.; "Design of a Contactless Battery Charger for Cellular Phone;" IEEE Transactions on Industrial Electronics; vol. 48; No. 6; Dec. 2001; pp. 1238-1247; 10 pages.
"Push for Standard Cellphone Charger Gains Ground;" http://www.nytimes.com/2009/02/17/technology/17iht-chargers.4.20250284.html?_r=0; downloaded on Feb. 20, 2014; 1 page.
Nathan O. Sokal; "Class-E Switching-Mode High-Efficiency Tuned RF/Microwave Power Amplifier: Improved Design Equations;" Microwave Symposium Digest; IEEE MTT-S International; pp. 779-782; vol. 2; Jun. 2000.
Wang, et al.; "Design and Analysis of an Adaptive Transcutaneous Power Telemetry for Biomedical Implants;" IEEE Transactions on Circuits and Systems—I: Regular Papers; vol. 52; No. 10; Oct. 2005; pp. 2109-2117; pp. 9 pages.
PCT Search Report and Written Opinion of the ISA for PCT/US/2012/060590 dated Apr. 15, 2013 (WO 2013/059300 A2); 10 pages.
U.S. Appl. No. 15/149,491, filed May 9, 2016, Perreault, et al.
International Preliminary Report on Patentability dated Jun. 7, 2016 for PCT Application No. PCT/US2014/066268; 6 pages.
Search Report dated Apr. 23, 2015 for PCT Application No. PCT/US2014/066268; 4 pages.
Written Opinion dated Apr. 23, 2015 for PCT Application No. PCT/US2014/066268; 5 pages.

* cited by examiner

METHOD AND APPARATUS FOR WIRELESSLY CHARGING PORTABLE ELECTRONIC DEVICES

RELATED APPLICATIONS

This application is a U.S. National Stage of PCT application PCT/US2014/066268 filed in the English language on Nov. 19, 2014, and entitled "METHOD AND APPARATUS FOR WIRELESSLY CHARGING PORTABLE ELECTRONIC DEVICES," which claims the benefit under 35 U.S.C. § 119 of provisional application No. 61/911,160 filed Dec. 3, 2013, which application is hereby incorporated herein by reference in its entirety.

FIELD

The subject matter described herein relates generally to electronic devices and, more particularly, to wireless charging of electronic devices.

BACKGROUND

There are a multitude of portable, battery powered electronic devices in existence today. When the batteries in these devices run out of power, a user either has to replace the batteries or recharge them. In the distant past, rechargeable batteries had to be removed from the corresponding device and inserted into a separate battery charger to be recharged. Later, devices were made available that would allow batteries to be charged within the devices themselves by attaching the device to an AC powered transformer or charging station. Further progress was made with devices that would automatically recharge when physically connected to a data port of a larger system (e.g., an MP3 player that recharges when connected to a USB port of a computer). A more recent advance allows portable devices to be recharged wirelessly. As the name implies, wireless charging systems allow portable devices to be charged without the use of a charging cable or physical connection. That is, energy is transferred to the device through the air and, when received, is converted to a form that allows a battery in the device to be charged.

Wireless charging has many benefits. One of the benefits is convenience. That is, a device can be charged without having to physically connect it to a charging structure. Thus, a cell phone can be charged while it sits untethered on a user's desk. For certain types of devices that are difficult or impossible to connect to a wired charging unit, wireless charging is especially valuable (e.g., battery powered medical implants, wearable electronics, etc.). The lack of a need for wired charging structures also has environmental benefits. For example, it has been estimated that wired chargers account for 51,000 tons of waste per year in the United States. Much of this waste can be eliminated with widespread adoption of wireless charging.

There is a need for techniques and systems that are capable of implementing wireless charging in a convenient, reliable, and cost effective manner.

SUMMARY

The techniques, circuits, and systems described herein relate to wireless charging of portable electronic devices. More particularly, the techniques, circuits, and systems relate to methods for detecting load variations within a transmitter that is wirelessly charging another device and for dynamically compensating for these load variations during charging to increase system efficiency and regulate power delivery. The techniques, circuits, and systems described herein are particularly well suited for use in providing charging from one portable device to another.

In accordance with one aspect of the concepts, systems, circuits, and techniques described herein, an electronic device comprises: a power amplifier circuit for use in wirelessly charging an external portable device, the power amplifier having a switching transistor and a resonant circuit, the resonant circuit having at least one variable capacitance and at least one variable inductance, the variable inductance being positioned for magnetic coupling to an inductance within the external portable device, the external portable device creating a time varying load within the electronic device during charging operations; and a load variation detection and compensation circuit to identify load variation within the power amplifier circuit based on feedback from the power amplifier circuit and to generate control signals to adjust the at least one variable capacitance and the at least one variable inductance of the resonant circuit to compensate for variations in load, wherein the load variation detection and compensation circuit operates continually during charging operations to compensate for time varying load.

In one embodiment, the feedback from the power amplifier circuit is a switch voltage associated with the switching transistor; and the load variation detection and compensation circuit includes at least one comparator to compare the switch voltage to first and second reference voltages.

In one embodiment, the load variation detection and compensation circuit includes logic circuitry to process the output of the at least one comparator to determine whether the switch voltage is higher than, lower than, or within a voltage range defined by the first and second reference voltages and to generate the control signals based thereon.

In one embodiment, the load variation detection and compensation circuit is configured to adjust the at least one variable capacitance and the at least one variable inductance, based on the comparison, in a manner that maintains approximately zero switch turn-on voltage to achieve enhanced efficiency and to regulate the power delivered to the external portable device.

In one embodiment, the power amplifier circuit includes a class-E power amplifier.

In one embodiment, the at least one variable capacitance and the at least one variable inductance of the resonant circuit includes a set of discrete capacitors and a multi-tapped transmit coil, respectively, the set of discrete capacitors and a multi-tapped transmit coil having N switchable capacitance-inductance value pairs, wherein N is a positive integer greater than 1.

In one embodiment, the electronic device further comprises a battery terminal for connection to a battery, wherein the power amplifier uses energy from the battery to wirelessly charge the external portable device during charging operations.

In accordance with another aspect of the concepts, systems, circuits, and techniques described herein, a machine implemented method for wirelessly charging a portable electronic device comprises: applying an input signal to a switched power amplifier to generate a time varying current within a variable inductance of a resonant circuit of the switched power amplifier, the variable inductance being magnetically coupled to a coil within the portable electronic device to be charged; determining whether a feedback voltage from the switched power amplifier is above, below, or within a predetermined voltage range; and modifying the variable inductance and a variable capacitance of the resonant circuit of the power amplifier if the feedback voltage is above or below the predetermined voltage range to compensate for load variation and leaving the variable inductance and the variable capacitance in their present settings if the feedback voltage is within the predetermined voltage range.

In one embodiment, the feedback voltage of the switched power amplifier is a switch voltage at a time just before the switch turns on during a switching cycle.

In one embodiment, the load variation within the power amplifier is due, in part, to one or more of the following: coupling variations between the variable inductance and the coil within the portable electronic device and changing battery charge level within the portable electronic device.

In accordance with a further aspect of the concepts, systems, circuits, and techniques described herein, a portable electronic device is provided that is capable of wirelessly charging other portable electronic devices. More specifically, the portable electronic device comprises: a battery terminal for connection to a battery; power amplifier circuitry, coupled to the battery terminal, for use in wirelessly charging an external portable device, the power amplifier circuitry having a switching transistor and a resonant circuit, the resonant circuit having at least one variable capacitance and at least one variable inductance, the variable inductance for magnetic coupling to an inductance within the external portable device, wherein the external portable device can create a time varying load within the power amplifier circuitry during charging operations; comparison circuitry to compare feedback from the power amplifier circuitry to one or more reference voltages to identify load variations in the power amplifier circuitry; and compensation circuitry to generate control signals for the at least one variable capacitance and the at least one variable inductance of the power amplifier circuitry based at least in part on the comparison result, to adjust the at least one variable capacitance and the at least one variable inductance in a manner that maintains approximately zero switch turn-on voltage for the switching transistor to achieve enhanced efficiency and to regulate the power delivered to the external portable device.

In one embodiment, the comparison circuitry and the compensation circuitry are configured to operate continually during charging operations to compensate for time varying load.

In one embodiment, the power amplifier circuitry is configured to convert a DC voltage from the battery to a radio frequency (RF) signal to generate a time varying current within the at least one variable inductance.

In one embodiment, the portable electronic device includes a cellular telephone.

In one embodiment, the external portable device includes one of the following: a wearable electronic device, a wireless accessory, and a medical implant.

In one embodiment, the external portable device includes one of the following: a smart wristband, a smart watch, a smart glove, a bicycle light, a portable multi-media player, a wireless input/output device, a pager, and a cochlear implant.

In accordance with a further aspect of the concepts, systems, circuits, and techniques described herein, a portable electronic device is provided that is capable of charging other portable electronic devices. More specifically, the portable electronic device comprises: a battery terminal for connection to a battery; a class-E power amplifier coupled to the battery terminal, the class-E power amplifier having a switching transistor and a resonant circuit, the resonant circuit having at least one variable capacitance and at least one variable inductance, the at least one variable inductance for magnetic coupling to a coil within an external portable device to be charged, wherein the at least one variable inductance in the first portable electronic device and the coil in the external portable device form a transformer between the devices during a charging operation, wherein a load of the external portable device is reflected into the portable electronic device through the transformer; comparison circuitry to determine whether a voltage across an output of the switching transistor is above, below, or within a predetermined voltage range at a particular point within a switching cycle of the switching transistor of the class-E power amplifier; and compensation circuitry to adjust the at least one variable capacitance and the at least one variable inductance if the comparison circuitry determines that the voltage across the output of the switching transistor is above or below the predetermined voltage range, wherein the compensation circuitry is configured to perform no adjustment to the at least one variable capacitance and the at least one variable inductance if the comparison circuitry determines that the voltage across the output of the switching transistor is within the predetermined voltage range.

In one embodiment, the at least one variable capacitance and the at least one variable inductance of the resonant circuit are capable of switching between a predetermined number of capacitance-inductance value pairs that have a particular order, wherein the compensation circuitry is configured to activate a next capacitance-inductance value pair in the order if the comparison circuitry determines that the voltage across the output of the switching transistor is above the predetermined voltage range and the compensation circuitry is configured to activate a previous capacitance-inductance value pair in the order if the comparison circuitry determines that the voltage across the output of the switching transistor is below the predetermined voltage range.

In one embodiment, the comparison circuitry is configured to sample the voltage across the output of the switching transistor just before the transistor turns back on during the switching cycle, wherein the comparison circuitry is synchronized to the switching frequency of the switching transistor but samples at a lower rate.

In one embodiment, the compensation circuitry is configured to adjust the capacitance value of the at least one variable capacitance and the inductance value of the at least one variable inductance in a continual manner to dynamically compensate for changes in primary side load in the portable electronic device.

In one embodiment, the portable electronic device is configured to cease charging another portable electronic device when the other portable electronic device has reached a predetermined level of charging that is less than a maximum level of charging.

BRIEF DESCRIPTION OF THE DRAWINGS

The foregoing features may be more fully understood from the following description of the drawings in which.

DETAILED DESCRIPTION

Figure 1:
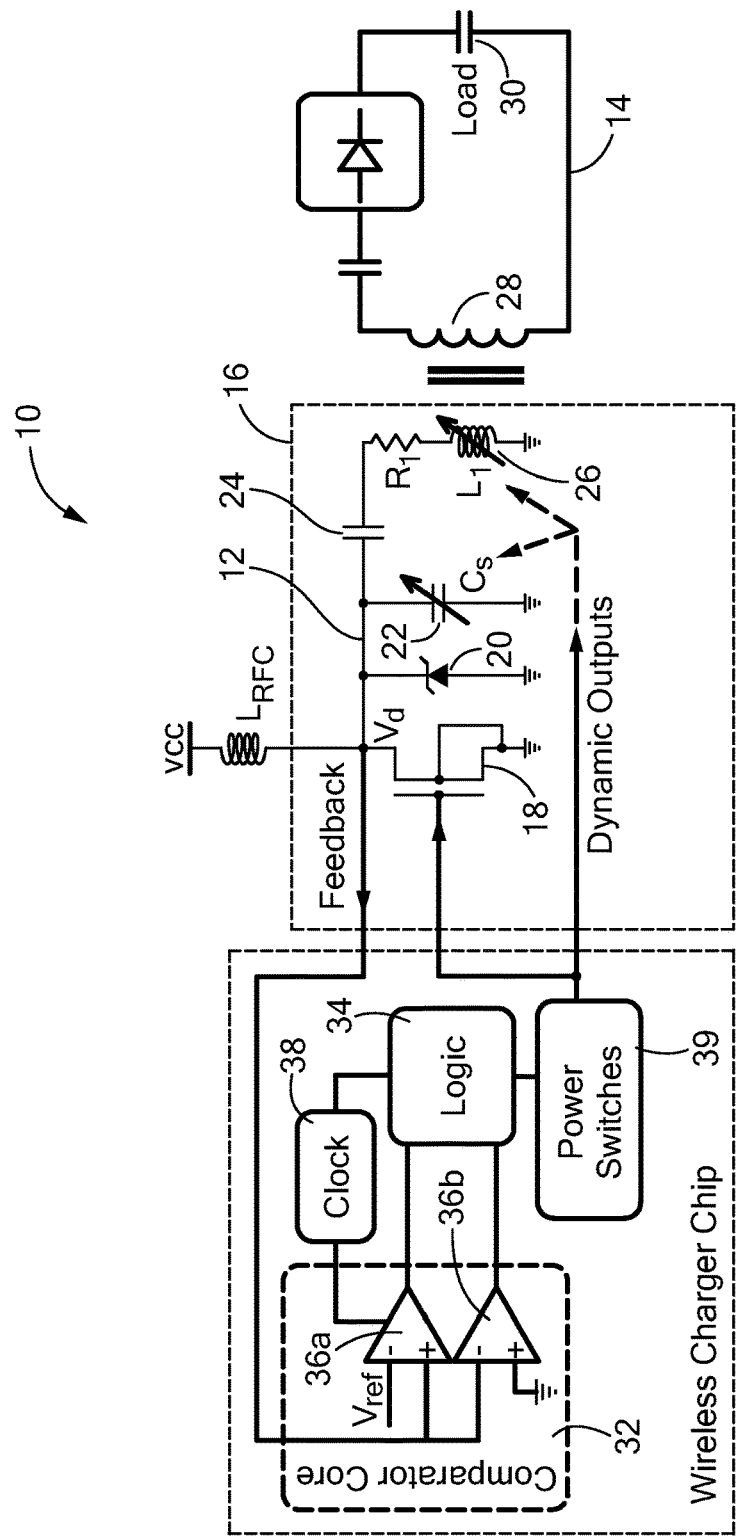
FIG. 1 is a is a schematic diagram illustrating a system for performing wireless device-to-device charging.

Techniques and systems described herein relate to wireless charging of portable electronic devices. Although useful in all wireless charging contexts, the techniques and systems described herein are particularly suited for use in charging portable devices using other portable devices. Device-to-device wireless charging is a proposed technology for transferring energy from a higher-power portable device to charge a lower-power portable device. This technique may be useful in many different scenarios. For example, a user with a cellular telephone may use the telephone to wirelessly charge a wearable electronic device, such as a smart watch. In another scenario, a user may use a tablet computer to charge a medical implant, such as a cochlear implant. Many other combinations of devices are also possible.

Recently, a number of companies have released products for wirelessly charging cell phones. Other companies, such as Google with its Nexus products, have released cell phones that can be wirelessly charged. In many cases, some of the same circuitry that is used for wireless power reception within these cell phones can be augmented for use in wireless power transmission to charge other devices. From a cost and form factor perspective, it may be possible to adapt these existing cell phones to wirelessly charge various lower-power portable devices that are often in the vicinity of the phone. These lower power portables may include, for example, wearable electronics (e.g., smart wristbands, smart watches, etc.), outdoor-use electronics (e.g., bicycle lights, MP3 players, etc.), wireless accessories (e.g., wireless keyboards, wireless mice, etc.), medical implants (e.g., cochlear implants, etc.), and/or others.

To date, the authors are aware of no available systems or devices that perform device-to-device wireless charging as described above. This may be because of a number of challenges that must be overcome to implement such as system. For example, device-to-device wireless charging involves positioning two movable devices (a transmitter device and a receiver device) with respect to each other, so there is an inherent time-varying coupling between the devices that causes the transmitter to experience a time-varying load. In addition to the time varying coupling between the devices, additional load variations will be presented to the transmitter device as the receiver device charges up. Current wireless power systems, which are designed for stationary devices with relatively constant loading conditions, provide widely varying efficiencies and power levels under load variation. This is a problem for device-to-device charging, where consistently high efficiency is desired for long cell-phone battery life and consistently stable power levels are desired for rapid and safe charging.

In some aspects described herein, a device-to-device wireless charging system is provided with transmitter-side circuitry that is capable of detecting and dynamically compensating for load variations to maintain high efficiency and regulate power levels. This may be achieved by using a power amplifier circuit having one or more tunable elements and a digital processor circuit that is capable of analyzing feedback from the power amplifier and using the feedback to adjust the tunable elements in a manner that achieves high efficiency and regulated power.

FIG. 1 is a schematic diagram illustrating a system 10 for performing wireless device-to-device charging. As shown, the system 10 includes a transmitter device 12 and a receiver device 14. The transmitter device 12 charges the receiver device 14 using energy from a local energy storage device (e.g., a battery). The transmitter device 12 may include one or more terminals for connection to a removable energy storage device. The basic system is a standard resonant magnetic wireless power transfer topology, operating in the 6.78 MHz ISM band. Briefly, the system works by converting the DC voltage VCC to an AC voltage in the transmitter device 12 through a Class-E power amplifier 16 consisting of a MOSFET 18, a shunt diode 20, a shunt capacitor ($C_S$) 22, and a series capacitor 24 and inductor ($L_1$) 26. The AC voltage generates a sinusoidal current through the primary-side coil $L_1$ 26, which generates a magnetic field that induces a sinusoidal current through the secondary-side coil 28 in the receiver device 14. This current in the receiver device 14 is rectified and delivered to charge a load 30. The load 30 may include, for example, a battery or other energy storage device.

In addition to the power amplifier 16, the transmitter device 12 may also include feedback circuitry to detect load variation and compensation circuitry to dynamically adjust the shunt capacitance ($C_S$) and series inductance ($L_1$) (both of which are variable) based on load variation. The feedback circuitry relates the drain voltage of the power amplifier transistor (e.g., MOSFET 18) to the load as seen by the primary side. The load seen by the primary side (or primary-side load) is the secondary load reflected across the transformer that is formed by the transmitter and receiver coils 26, 28 and the coupling coefficient between.

Figure 2:
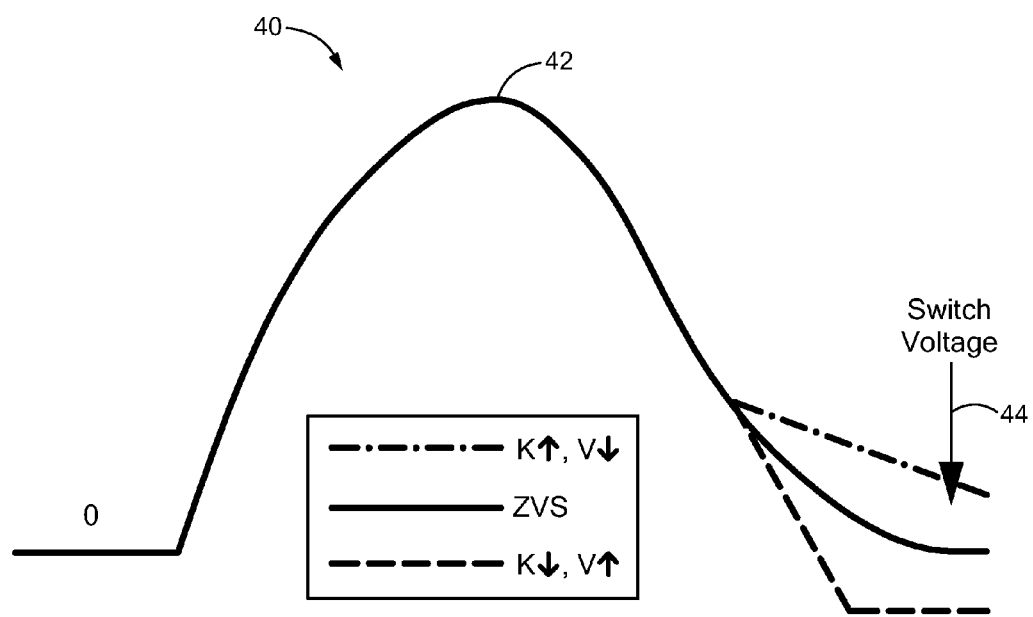
FIG. 2 is a diagram illustrating how drain voltage varies over one switching cycle of a switching transistor in a wireless charging device.

FIG. 2 is a waveform diagram illustrating the drain voltage over one switching cycle for the MOSFET 18 of FIG. 1. As shown, the drain voltage is initially at zero volts when the MOSFET 18 is on, rises to a peak 42 when the MOSFET 18 turns off, and then falls back towards zero until the point indicated by the arrow 44 at which time the MOSFET turns back on. Ideally, the switch voltage is zero at that time, but changing coupling and load can cause the switch voltage to be nonzero. It can be shown mathematically from analyzing the Class-E power amplifier that increasing the primary-side load (by increasing coupling or decreasing load voltage) causes the switch voltage to tend positive, while decreasing the primary-side load (by decreasing coupling or increasing load voltage) causes the switch voltage to tend negative. Thus, measuring the switch voltage just before the MOSFET turn-on time 44 gives an indication of changing load conditions as seen by the primary side.

Returning to the embodiment of FIG. 1, the feedback circuitry may include a comparator core 32 having two comparators 36a, 36b that compare the switch voltage at the MOSFET turn-on time (or switch turn-on voltage) to two reference voltages (e.g., $V_{ref}$ and ground). These two reference voltages define the low and high limits of a voltage range. Decision and compensation logic 34 may be coupled to the outputs of the comparators 36a, 36b to, among other things, determine whether the switch voltage is within, above, or below the voltage range defined by the two reference voltages (e.g., a range from $-V_{ref}$ to $+V_{ref}$). In other words, the decision and compensation logic 34 determines if the switch voltage is sufficiently close to zero, above zero, or below zero at the MOSFET turn-on time. This, in turn, gives an indication of whether the primary side load has stayed the same, increased, or decreased, respectively, since the last comparator sample. While the comparators 36a, 36b sample the switch voltage synchronized to the power amplifier MOSFET drive clock, the comparators 36a, 36b sample at a rate controlled by a slower independent clock 38. Each time the comparators 36a, 36b take a sample, the decision logic makes a determination, and the result is passed to the compensation logic to dynamically adjust the shunt capacitance ($C_S$) 22 and the series inductance ($L_1$) 26. In some implementations, the logic 34 may also be used to control the switching of the switching transistor 18.

The decision and compensation logic 34 may be implemented in a variety of ways. For example, in one approach, the logic may be implemented using conventional logic gates. In other embodiments, more complex processing structures may be used (e.g., a general purpose microprocessor, a digital signal processor (DSP), a reduced instruction set computer (RISC), a field programmable gate array (FPGA), a programmed logic array (PLA), an application specific integrated circuit (ASIC), a microcontroller, an embedded controller, a processor complex, and/or others). Such processors may also, or alternatively, be used to perform other control functions in support of the charging capabilities of the transmitter device 12. In some embodiments, the comparison function and the decision logic function may be implemented within a common processor. In some embodiments, all of the load variation detection and compensation circuitry may be integrated onto a common semiconductor chip. It should be understood that any combination of hardware, software, and/or firmware may be used in different implementations.

To explain the need for a compensation circuit, the theory behind the circuit will now be described through a series of steps. First, adjusting the switch turn-on voltage has a significant effect on the wireless power transfer efficiency. Positive switch turn-on voltages cause switching losses due to the parasitic and discrete capacitances at the output of the power amplifier switch. Negative switch turn-on voltages cause conduction losses due to the forward voltage drop of the power amplifier switch body diode and the parasitic resistances of the power amplifier circuit. The optimum point for highest power transfer efficiency is around zero switch turn-on voltage.

Second, adjusting the shunt capacitance ($C_S$) and series inductance ($L_1$) has a significant effect on the switch turn-on voltage. This effect is described in "Class-E Switching-Mode High-Efficiency Tuned RF Microwave Power Amplifier: Improved Design Equations," by Nathan Sokal, Proceedings of the IEEE International Microwave Symposium, Boston, pages 9-20, June 2000. It can be shown mathematically that for a zero switch turn-on voltage, the shunt capacitance must be decreased and the series inductance must be increased proportional to increasing primary-side load. The opposite is true for decreasing primary-side load.

Third, adjusting the shunt capacitance ($C_S$) has a significant effect on the delivered power. It can be shown that for a given series inductance ($L_1$), increasing the shunt capacitance decreases the delivered power and decreasing it increases the delivered power. At the same time, load variation causes widely varying delivered power. In particular, increasing primary-side load decreases the primary-side Q, decreasing delivered power, and decreasing load increases primary-side Q, increasing delivered power. Putting the two together, increasing the shunt capacitance when the primary-side load decreases or decreasing the shunt capacitance when the primary-side load increases serves to regulate the delivered power. This is the same response to load variation that increases system efficiency as described above.

To summarize, the goal of the compensation circuitry is to use the determination from the feedback circuitry of whether the load has increased or decreased in order to adjust appropriately the shunt capacitance ($C_S$) and series inductance ($L_1$). This maintains approximately zero switch turn-on voltage for maximum efficiency and also regulates the delivered power.

Figure 3:
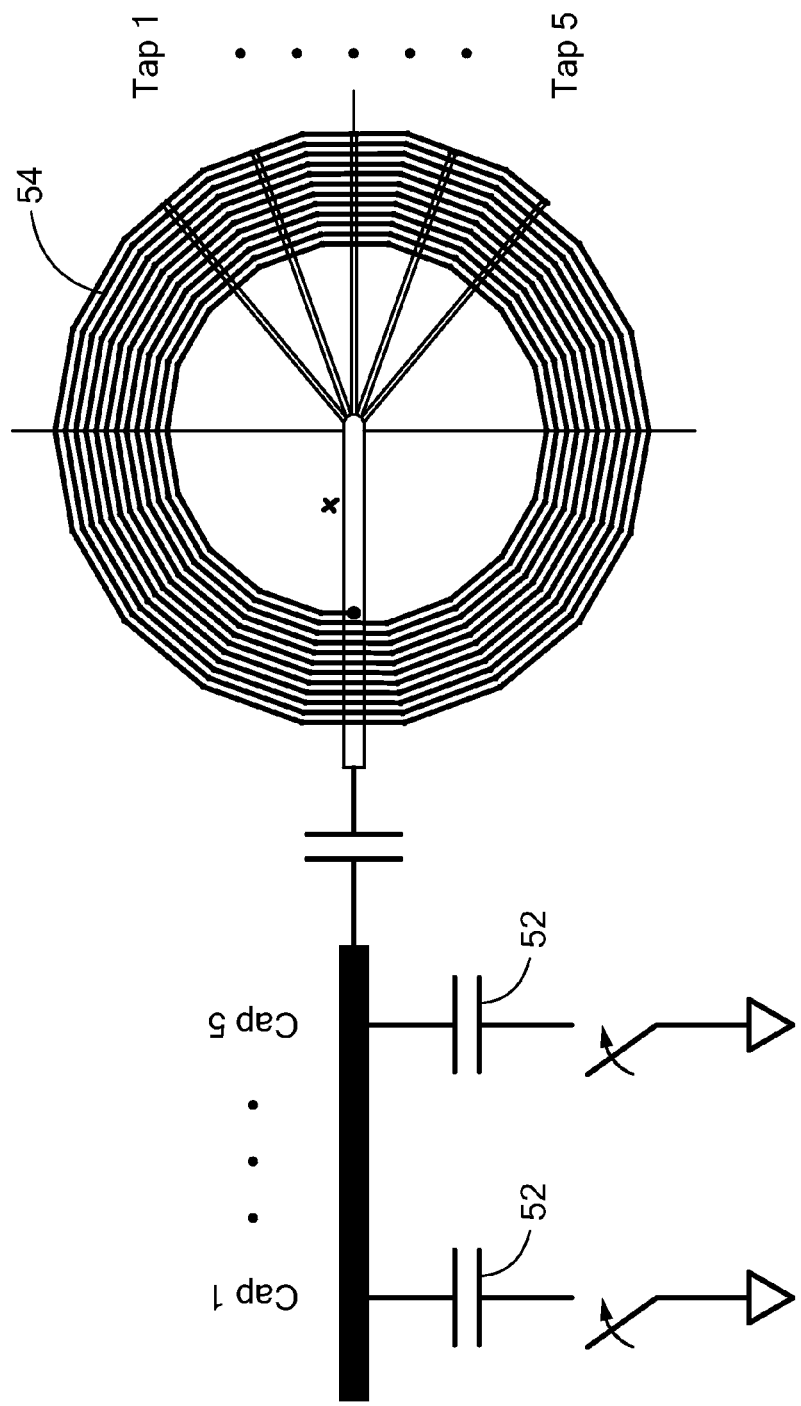
FIG. 3 is a diagram illustrating tuning elements within an exemplary transmitter device where an adjustable shunt capacitance ($C_S$) and series inductance ($L_1$) are implemented as a set of discrete capacitors and a multi-tapped transmit coil in accordance with an embodiment.

The variable shunt capacitance 22 and the variable series inductance 26 may be implemented in a variety of different ways. In some embodiments, the variable shunt capacitance 22 and the variable series inductance 26 may be implemented using switching techniques. FIG. 3 is a diagram illustrating such an embodiment with the adjustable shunt capacitance ($C_S$) being implemented as a set of discrete capacitors 52 and the adjustable series inductance ($L_1$) being implemented as a multi-tapped transmit coil 54 in the system. The compensation circuitry may control a set of MOSFET switches (e.g., power switches 39 of FIG. 1) in series with each of the capacitors and taps to adjust the values. In one embodiment, there are five possible values for capacitance, each corresponding to a distinct value for inductance. Thus, there are five switchable capacitance-inductance value pairs (although any number of pairs greater than 1 may be used in other embodiments). After the feedback circuitry makes a determination, the compensation circuitry either does nothing if the load has not changed or switches the capacitance-inductance value one step in the correct direction. In at least one embodiment, the feedback circuitry and the MOSFET switches in the compensation circuitry are integrated in 0.18 um CMOS.

Figure 4:
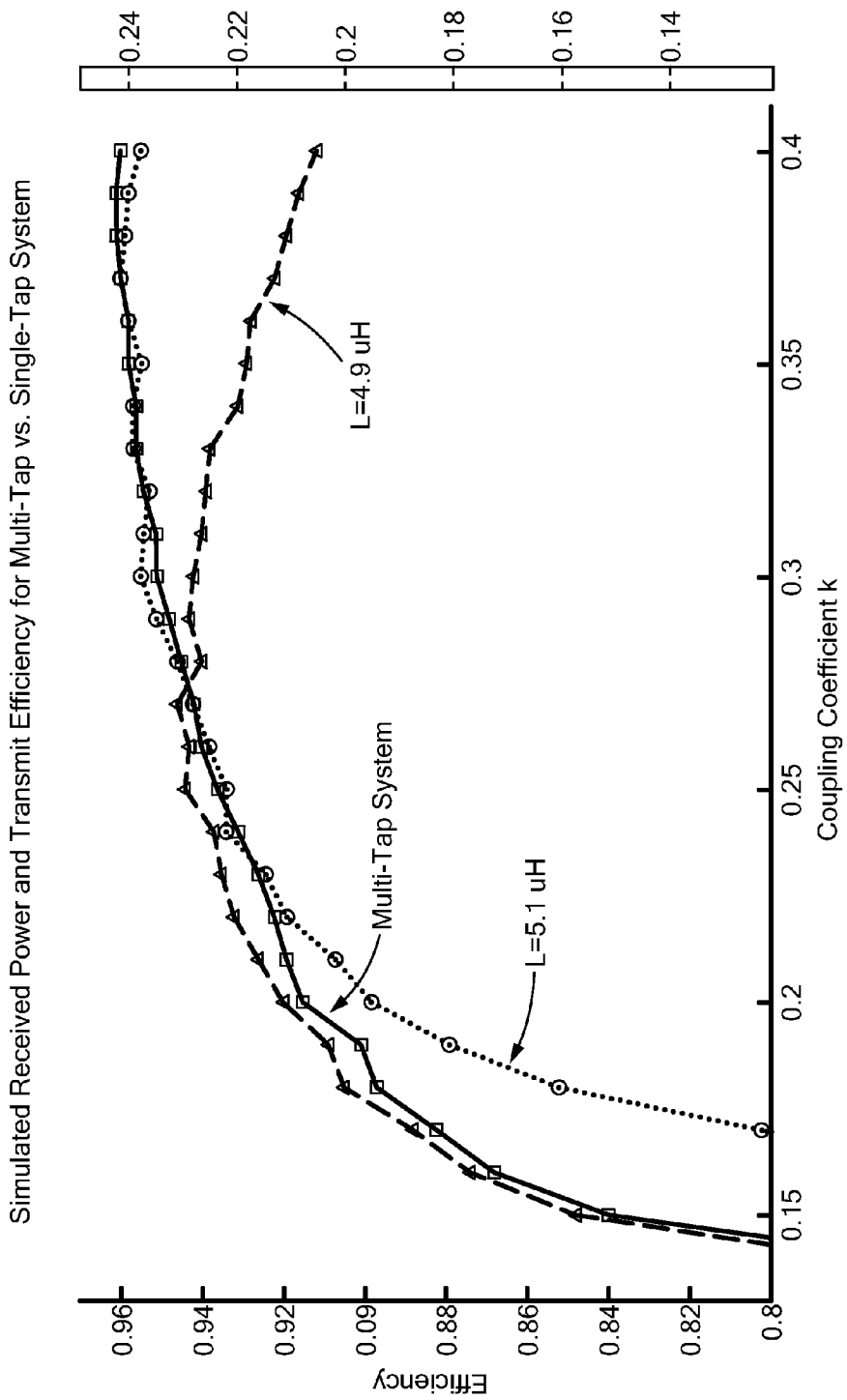
FIG. 4 is a diagram illustrating simulation results of the system efficiency and delivered power of an adaptive system compared to two non-adaptive systems, versus changing coupling conditions.

The load variation detection and compensation circuit described above has many advantages over previous work. For example, FIG. 4 shows simulation results of the system efficiency and delivered power of the adaptive system compared to two non-adaptive systems, versus changing coupling conditions. Efficiency includes power amplifier and coupling efficiency. As shown, the efficiencies of the non-adaptive systems are much lower than the efficiency of the load-adaptive system at the extremes of the coupling conditions. The simulations also showed that the power levels of the non-adaptive systems vary much more widely over coupling than the power levels of the load-adaptive system.

Figure 5:
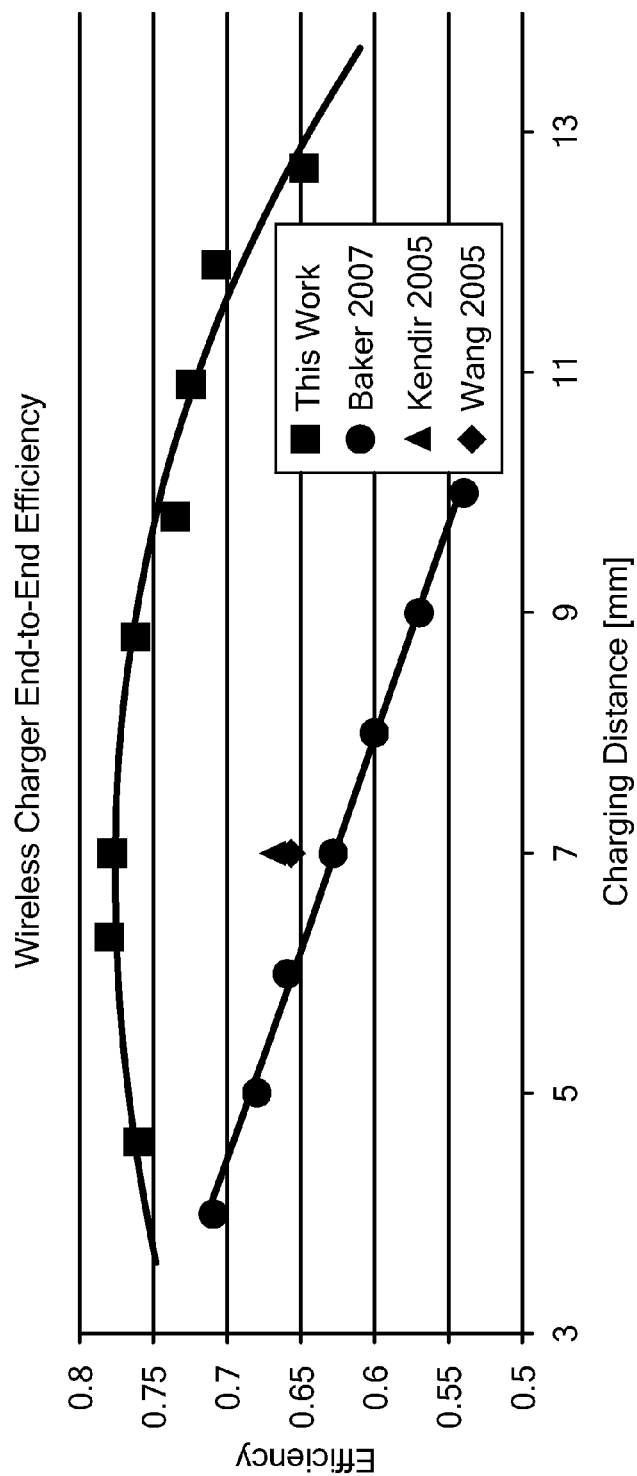
FIG. 5 is a diagram comparing the measured end-to-end efficiency of an exemplary system against previous systems versus changing coupling distance.

FIG. 5 compares the measured end-to-end efficiency of the system against previously published systems versus changing coupling distance. As shown, the present system achieves significantly higher efficiency than previous work.

Figure 6:
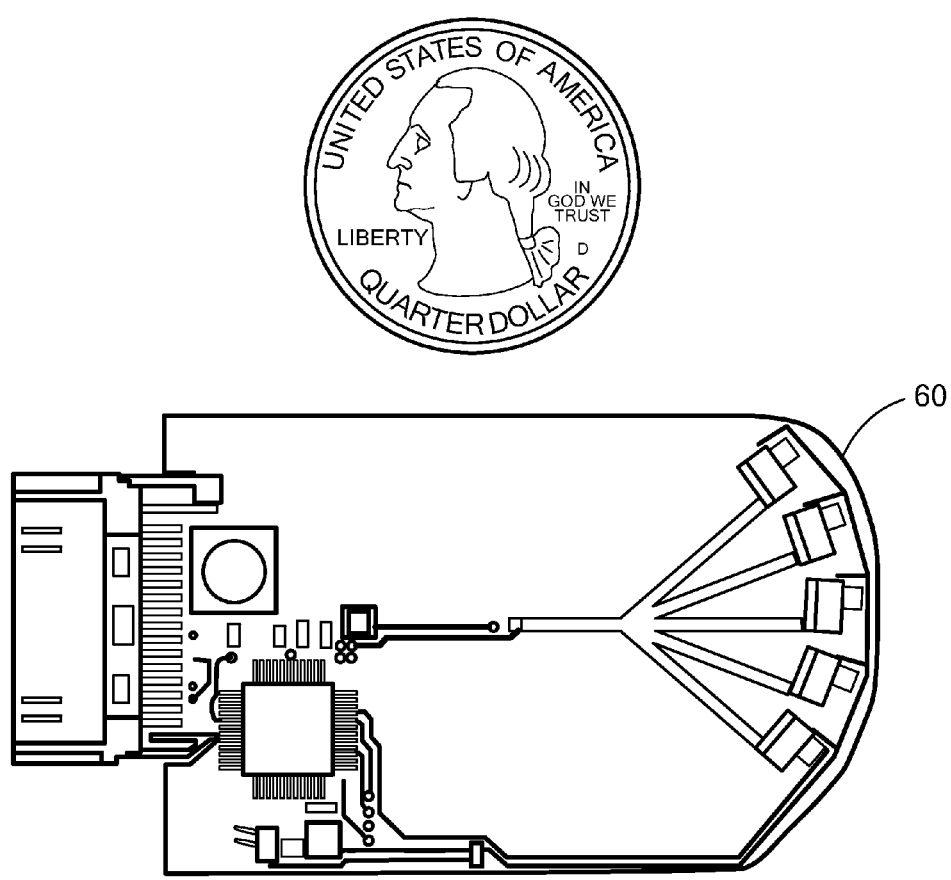
FIG. 6 is a diagram illustrating an exemplary plug-in transmitter device in accordance with an embodiment.

It is believed that there is great potential for commercial applications for systems having the described characteristics. Many applications for both wireless charger transmitters and receivers exist. In terms of wireless charger transmitters, in one embodiment, a cell phone accessory is provided that plugs into a cellular or smart phone and draws from the phone's internal battery to charge portable devices. FIG. 6 illustrates an exemplary plug-in transmitter device 60 that may be used with smartphones such as the iPhone 4® or iPhone 4S®. In other embodiments, modifications may be made to existing wireless power receivers in various cell phones to support wireless charging of portable devices.

Figure 7:
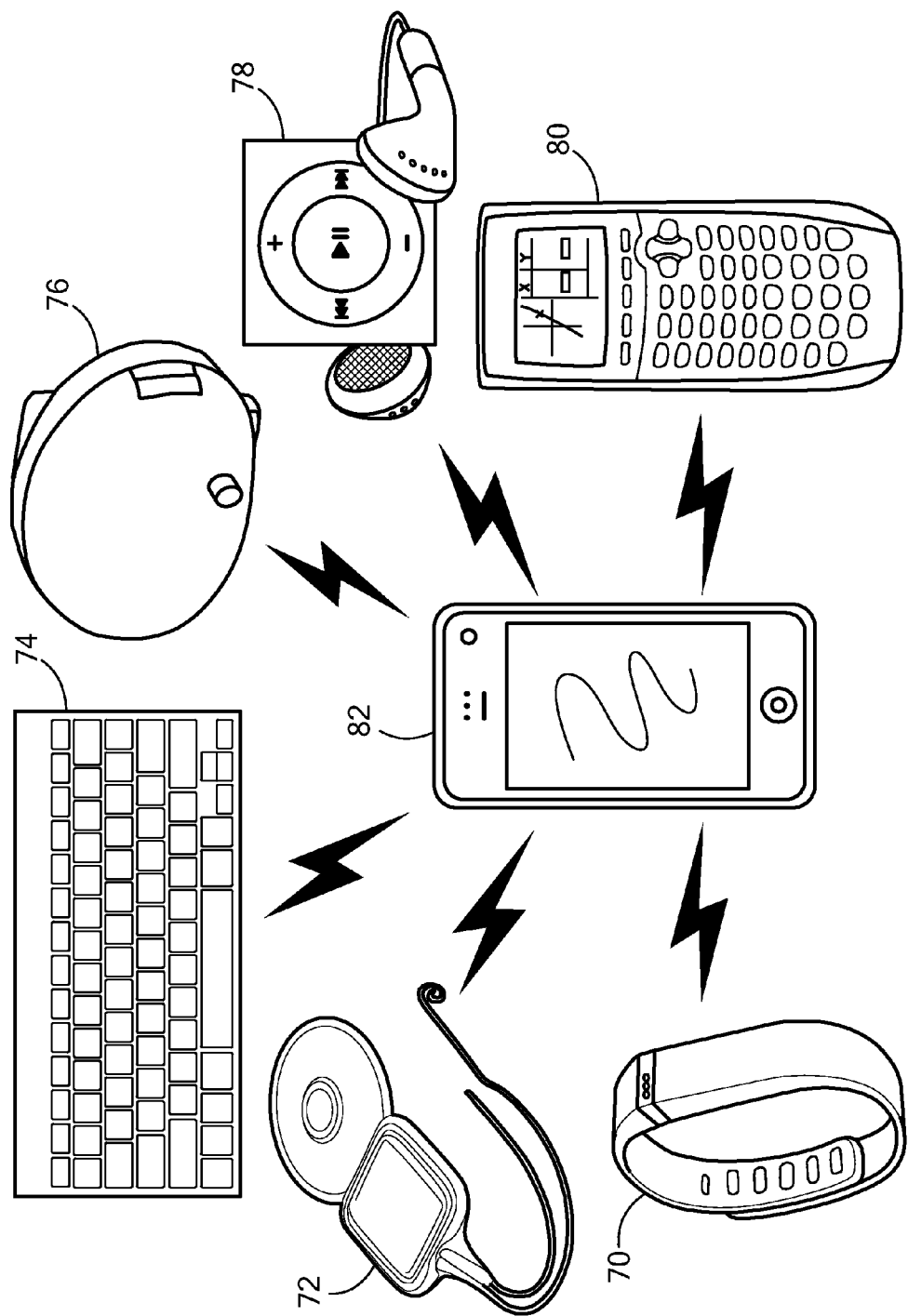
FIG. 7 is a diagram illustrating various portable devices that may benefit from wireless charging.

In terms of wireless charger receivers, there are many portable devices that could be outfitted with wireless charging circuitry. FIG. 7 is a diagram illustrating various portable devices that could benefit from wireless device to device charging. These include wearable electronics such as "smart" wristbands 70, medical implants such as cochlear implants 72, wireless accessories such as Bluetooth keyboards 74, outdoor electronics such as bike lights 76 and MP3 players 78, AA or AAA battery-operated devices such as calculators 80 or remote controls, and many others. Each of these devices may be equipped with wireless charging receivers that will operate with corresponding wireless charging transmitters. All of these devices may be charged from a single portable device, such as a smart phone 82. Because of the efficiency and regulated power transfer of various embodiments described herein, such charging may be performed with low battery drain in the transmitting unit (e.g., smart phone 82). In some implementations, portable devices may be charged in a relatively short period of time (e.g., 2-5 minutes) for a day's use. By limiting charging duration in this manner, battery drain in the transmitting unit may be further reduced.

In different embodiments, the charging of a portable device may be either user-initiated or automatic. In a user-initiated approach, a user might first place the device to be charged within proximity of the charging device (if not already in proximity) and/or into a desired orientation. The user might then initiate the charging process in the transmitter device. During the charging process, the system will continuously adapt to changing load conditions (caused by varying coupling and/or changing receiver device charge level). The process may be terminated when a desired charge level has been reached. In some embodiments, the process may be ceased before a full charge has been achieved (e.g., to save energy within the transmitter device).

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described various exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A portable electronic device that is capable of charging other portable electronic devices, the portable electronic device comprising:
   a battery terminal for connection to a battery;
   a class-E power amplifier coupled to the battery terminal, the class-E power amplifier having a switching transistor and a resonant circuit, the resonant circuit having at least one variable shunt capacitance and at least one variable inductance, the at least one variable inductance for magnetic coupling to a coil within an external portable device to be charged, wherein the at least one variable inductance in the first portable electronic device and the coil in the external portable device form a transformer between the devices during a charging operation, wherein a load of the external portable device is reflected into the portable electronic device through the transformer;
   comparison circuitry to determine whether a voltage across an output of the switching transistor is above, below, or within a predetermined voltage range at a particular point within a switching cycle of the switching transistor of the class-E power amplifier; and
   compensation circuitry to adjust the at least one variable shunt capacitance and the at least one variable inductance if the comparison circuitry determines that the voltage across the output of the switching transistor is above or below the predetermined voltage range, wherein the compensation circuitry is configured to perform no adjustment to the at least one variable shunt capacitance and the least one variable inductance if the comparison circuitry determines that the voltage across the output of the switching transistor is within the predetermined voltage range; and
wherein:
   the comparison circuitry is configured to sample the voltage across the output of the switching transistor just before the transistor turns back on during the switching cycle, wherein the comparison circuitry is synchronized to the switching frequency of the switching transistor but samples at a lower rate.

2. The portable electronic device of claim 1, wherein:
at least one variable shunt capacitance and the at least one variable inductance of the resonant circuit are capable of switching between a predetermined number of capacitance-inductance value pairs that have a particular order, wherein the compensation circuitry is configured to activate a next capacitance-inductance value pair in the order if the comparison circuitry determines that the voltage across the output of the switching transistor is above the predetermined voltage range and the compensation circuitry is configured to activate a previous capacitance-inductance value pair in the order if the comparison circuitry determines that the voltage across the output of the switching transistor is below the predetermined voltage range.

3. The portable electronic device of claim 1, wherein:
the compensation circuitry is configured to adjust the capacitance value of the at least one variable shunt capacitance and the inductance value of the at least one variable inductance in a continual manner to dynamically compensate for changes in primary side load in the portable electronic device.

4. The portable electronic device of claim 1, wherein:
the portable electronic device is configured to cease charging another portable electronic device when the other portable electronic device has reached a predetermined level of charging that is less than a maximum level of charging.

5. The portable electronic device of claim 1, wherein:
the external portable device includes one of the following: a wearable electronic device, a wireless accessory, and a medical implant.

6. The portable electronic device of claim 1, wherein:
the external portable device includes one of the following: a smart wristband, a smart watch, a smart glove, a bicycle light, a portable multi-media player, a wireless input/output device, a pager, and a cochlear implant.

7. The portable electronic device of claim 1, wherein:
the power amplifier circuitry is configured to convert a DC voltage from the battery to a radio frequency (RF)

signal to generate a time varying current within the at least one variable inductance.

8. The portable electronic device of claim 1, wherein:
the portable electronic device includes a cellular telephone.

9. The portable electronic device of claim 1, wherein:
the comparison circuitry and the compensation circuitry are configured to operate continually during charging operations to compensate for time varying load.

10. The portable electronic device of claim 1, wherein:
the compensation circuit includes at least one comparator to compare the switch voltage to first and second reference voltages which define the predetermined voltage range.

11. The portable electronic device of claim 10, wherein:
at least one of the comparison and compensation circuitry includes logic circuitry to process the output of the at least one comparator to determine whether the switch voltage is higher than, lower than, or within a voltage range defined by the first and second reference voltages and to generate the control signals based thereon.

12. The portable electronic device of claim 10, wherein:
the comparison and compensation circuitry are configured to adjust the at least one variable shunt capacitance and the at least one variable inductance, based on the comparison, in a manner that maintains approximately zero switch turn-on voltage to achieve enhanced efficiency and to regulate the power delivered to the external portable device.

13. The portable electronic device of claim 1 wherein:
the at least one variable shunt capacitance and the at least one variable inductance of the resonant circuit includes a set of discrete capacitors and a multi-tapped transmit coil, respectively, the set of discrete capacitors and a multi-tapped transmit coil having N switchable capacitance-inductance value pairs, wherein N is a positive integer greater than 1.

14. The electronic device of claim 1 wherein the class-E power amplifier is configured to use energy from the battery to wirelessly charge the external portable device during charging operations.

15. The electronic device of claim 1 wherein the voltage across the output of the switching transistor corresponds to a feedback voltage of the class-E power amplifier measured at a time just before the switch turns on during a switching cycle.

* * * * *